(12) United States Patent
Ngo et al.

(10) Patent No.: US 6,333,263 B1
(45) Date of Patent: *Dec. 25, 2001

(54) METHOD OF REDUCING STRESS CORROSION INDUCED VOIDING OF PATTERNED METAL LAYERS

(75) Inventors: Minh Van Ngo, Union City; Simon S. Chan, Saratoga; Anne E. Sanderfer, Campbell; King Wai Kelvin Ko, San Jose, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/285,388

(22) Filed: Apr. 2, 1999

(51) Int. Cl.⁷ .................................................. H01L 21/44
(52) U.S. Cl. .................... 438/669; 438/720; 438/788; 438/627
(58) Field of Search ......................... 438/614, 627, 438/669, 759, 788, 707, 710, 720

(56) References Cited

U.S. PATENT DOCUMENTS

| | | | |
|---|---|---|---|
| 5,780,115 | * 7/1998 | Park et al. | 427/539 |
| 5,968,610 | * 10/1999 | Liu et al. | 427/579 |
| 6,020,274 | * 2/2000 | Ngo | 438/788 |
| 6,171,947 | * 1/2001 | Pangrie et al. | 438/624 |

* cited by examiner

Primary Examiner—Olik Chaudhuri
Assistant Examiner—Ginette Peralta

(57) ABSTRACT

Stress corrosion induced voiding of patterned metal layers is avoided or substantially reduced by removing etching residues before gap filling. Embodiments include etching an Al or Al alloy layer employing fluorine and/or chlorine chemistry, wet cleaning, treating with a nitrogen-containing plasma at a temperature of at least about 400° C. and gap filling with a dielectric material, e.g. HDP oxide by HDPCVD.

10 Claims, 4 Drawing Sheets

METHOD OF REDUCING STRESS CORROSION INDUCED VOIDING OF PATTERNED METAL LAYERS

RELATED APPLICATIONS

This application contains subject matter similar to subject matter disclosed in U.S. patent application Ser. No. 09/283,754 filed on Apr. 4, 1999.

TECHNICAL FIELD

The present invention relates to a method of manufacturing a multi-metal layer semiconductor device exhibiting improved electromigration resistance. The invention has particular applicability in manufacturing high density multi-metal layer semiconductor devices with design rules of 0.18 micron and under.

BACKGROUND ART

The escalating requirements for high density and performance associated with ultra large scale integration semiconductor devices require design rules of 0.18 micron and under, increased transistor and circuit speeds, high reliability and increased manufacturing throughput. The reduction of design features to 0.18 micron and under challenges the limitations of conventional interconnection technology.

Conventional subtractive etching methodology comprises forming a first inter-layer dielectric on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first inter-layer dielectric, and a photoresist mask is formed on the metal layer to define a desired conductive pattern. The metal layer is then etched through the photoresist mask to form the conductive pattern comprising metal features separated by gaps, such as a plurality of metal lines with interwiring spacings therebetween. A dielectric layer is then applied to the resulting conductive pattern to fill in the gaps and the surface is planarized, as by conventional etching or chemical-mechanical polishing (CMP) planarization techniques.

A through-hole is typically formed in an overlying inter-layer dielectric to expose an underlying metal feature for interconnection. In U.S. patent application Ser. No. 08/924,133 filed on Sep. 5, 1997, now U.S. Pat. No. 6,046,106 issued Apr. 4, 2000, a high density plasma (HDP) oxide is employed as a gap filling material to achieve superior conformal coverage vis-à-vis SOG and conventional oxides deposited by plasma enhanced chemical vapor deposition. HDP oxides also exhibit higher density than SOG, greater chemical stability, and greater etch resistance. The entire disclosure of U.S. patent application Ser. No. 08/924,133 is incorporated herein by reference.

As shown in FIGS. 1 and 2, conventional practices comprise depositing metal layer 11 on interlayer dielectric 10, which is typically formed on a semiconductor substrate containing an active region with transistors (not shown). After photolithography, etching is conducted to form a patterned metal layer comprising metal features 11a, 11b, 11c and 11d with gaps therebetween. A dielectric material 12, such as spin on glass (SOG), is typically deposited to fill in the gaps between the metal features, and baked at a temperature of about 300° C. to about 450° C., for a period of time up to about two hours, depending upon the particular SOG material employed. At a design rule of about 0.18 micron, metal lines shrink to a width of about 0.25 micron and interwiring spacings shrink to a width of about 0.3 micron. At such reduced dimensions, it is extremely difficult to satisfactorily fill in the interwiring spacings voidlessly and obtain adequate step coverage to form a reliable interconnection structure.

Conventional metal features comprise a composite layer comprising, for example, a lower metal barrier layer, such as titanium (Ti), an intermediate or primary conductive layer, e.g. aluminum or an aluminum alloy, and an anti-reflective coating (ARC) thereon, such as titanium nitride(TiN). Such a composite metal line is conventionally patterned into a plurality of metal features, e.g. conductive lines, employing anisotropic etching, typically with fluorine and/or chlorine chemistry. Subsequent to etching, a wet cleaning procedure is conducted in an attempt to remove etching residue. Such conventional wet cleaning typically comprises treatment with a solvent. Subsequent to cleaning, the gap filling dielectric layer is deposited to fill the gap between the metal features.

In conducting such conventional procedures, particularly as the design rule is scaled down to 0.18 micron and under, it is extremely difficult to effectively remove etching residues formed during patterning. Such etching residues are believed to attack the side surfaces of metal features and form voids. For example, ammonia from the cleaning solution can combine with residual chlorine from the etching process to form hydrochloric acid which attacks the side surfaces of the metal feature. Such corrosion of the side surfaces also results in voiding upon gap filling, thereby significantly increasing electromigration and, hence, significantly limiting the lifetime of the metal line as well as degrading device performance.

Electromigration in a metal interconnection line can be characterized by the movement of ions induced by a high electrical current density. Miniaturization demands long interconnects having small contacts and small cross-sections. Such reduced feature sizes are characterized by high electrical current density and, consequently, increased metalization electromigration failures. The increased susceptibility to electromigration as design features shrink is exacerbated by the corrosion of side surfaces of metal lines by etching residues and the formation of voids.

There exists a need for interconnect methodology enabling the formation of patterned metal lines without residues on side surfaces of the metal lines and without the generation of voids. There exists a particular need for interconnect methodology enabling gap filling patterned metal lines in semiconductor devices having a design rule of about 0.18 micron and under without an attendant decrease in electromigration resistance.

DISCLOSURE OF THE INVENTION

An advantage of the present invention is a method of manufacturing a semiconductor device having an interconnection structure with improved electromigration resistance.

Another advantage of the present invention is a method of manufacturing a semiconductor device with a design rule of about 0.18 micron and under, without any significant corrosion of the side surfaces of metal features and without any substantial void formation upon gap filling, thereby improving electromigration resistance.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other objects are achieved in part by a method of manufacturing a semiconductor device, the method comprising: forming a patterned metal layer comprising metal features having side surfaces with gaps therebetween; and treating the patterned metal layer with a nitrogen-containing plasma.

Embodiments of the present invention include forming a conductive line comprising a lower metal layer, such as W or Ti, a primary conductive metal layer such as aluminum or an aluminum alloy thereon and an ARC, such as Ti—TiN thereon, anisotropically etching using chlorine and/or fluorine chemistry to form a pattern of metal features separated by interwiring spaces, wet cleaning and subsequently treating the cleaned patterned metal line with a nitrogen-containing plasma at a temperature of at least about 400° C. to remove or substantially reduce etching residues and/or compounds which attack the side surfaces of the metal features. Embodiments further include gap filling with HDP oxide.

Additional advantages of the present invention will become readily apparent to those skilled in this art from the following detailed description, wherein only the preferred embodiment of the present invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
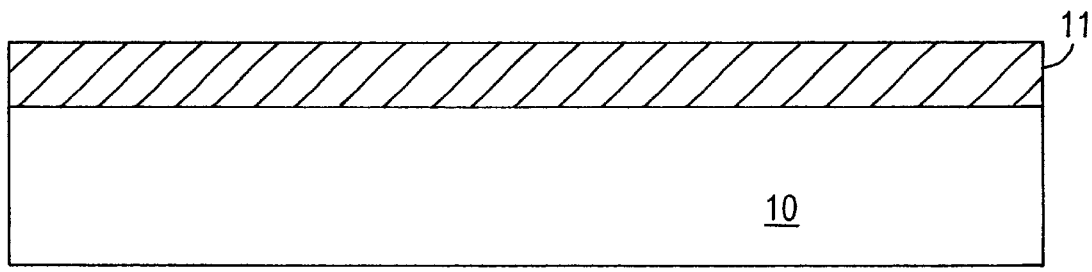
FIGS. 1 and 2 schematically illustrate sequential phases of a conventional method.
Figure 2:
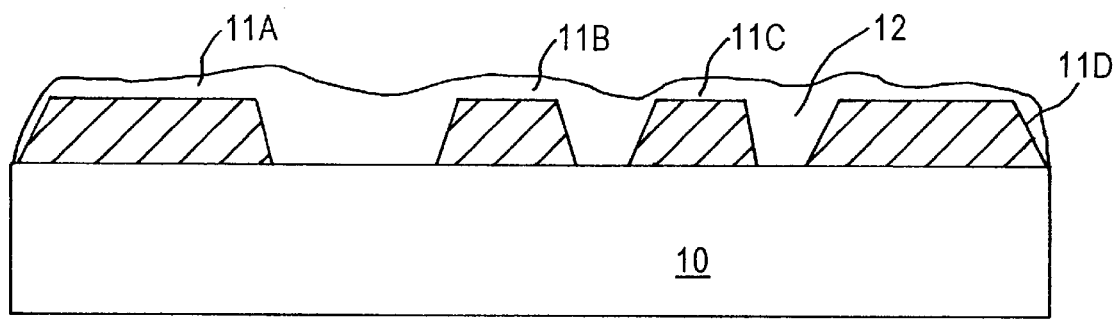
Figure 3:
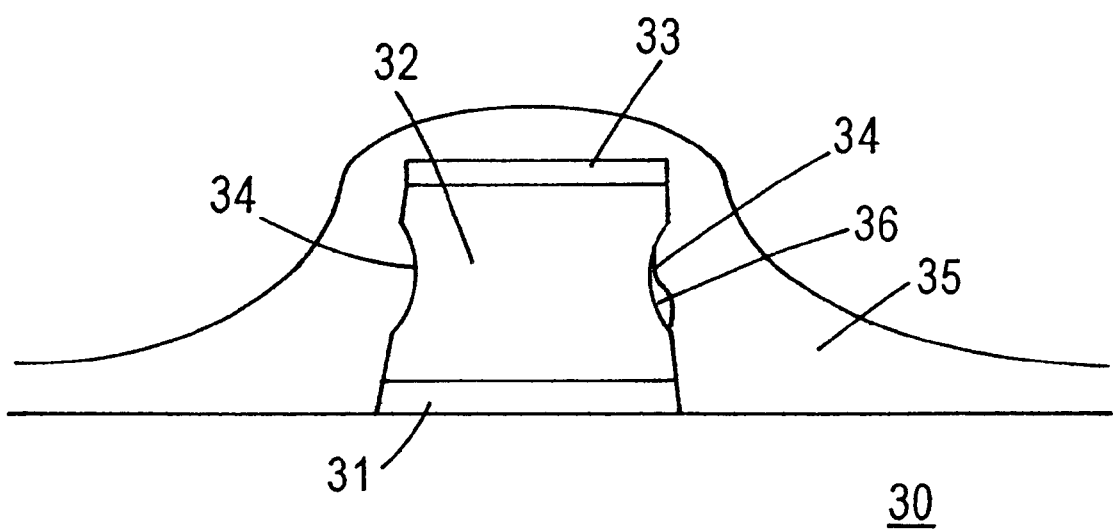
FIG. 3 illustrates the sidewall corrosion problem attendant upon conventional methodology.

The present invention addresses and solves the side surface corrosion problem encountered in patterning and gap filling closely spaced apart metal lines in an effort to satisfy the imposing demands for increased density in semiconductor devices. For example, a conductive layer is deposited and patterned on inter-layer dielectric 30 to form at least one metal feature comprising a lower barrier layer 31, a primary conductive layer 32 and an ARC 33, as shown in FIG. 3. As a result of anisotropic etching to pattern the metal layer and/or subsequent wet cleaning, residues are formed which attack the side surfaces of the metal feature, as by causing corrosion indicated by reference numeral 34, thereby creating electromigration problems. Moreover, after gap filling with dielectric material 35, such as HDP oxide, voids 36 are formed. Additional problems are created upon forming an interconnection between metal features on different levels employing borderless vias, because of the difficulty in filling high aspect ratio borderless via holes exacerbated by concavity 34.

In accordance with embodiments of the present invention, the foregoing and other problems are solved by exposing the patterned metal layer to a nitrogen-containing plasma prior to depositing the gap filling dielectric material. Embodiments of the present invention include etching a composite conductive layer, wet cleaning subsequent to etching, and then treating the cleaned patterned metal layer with a nitrogen-containing plasma at a temperature of at least about 400° C., prior to depositing a dielectric gap filing layer, such as HDP oxide. The exact mechanism underpinning the advantageous reduction in corrosion of the side surfaces of the metal feature and voiding, such as stress corrosion induced voiding, is not known with certainty. However, it is believed that treatment with a nitrogen-containing plasma effectively removes any residues formed as a result of etching and/or wet cleaning, thereby avoiding corrosive attack of the side surfaces of the metal feature.

Embodiments of the present invention comprise forming a conventional composite metal layer, etching the composite layer in a conventional manner employing, chlorine and/or fluorine chemistry, wet cleaning the patterned metal layer, as with a solvent, and then treating the patterned metal layer with the nitrogen-containing plasma at a temperature of about 350° C. to about 420° C., for about 20 seconds to about 70 seconds. Given the objectives of the present invention and guidance set forth herein, the optimum nitrogen-containing plasma treating conditions can be determined in a particular situation. For example, it was found suitable to employ a nitrogen flow rate of about 1,000 to about 5,000 sccm, a source power of about 500 to about 2,500 watts, a bias power of about 200 to about 2,800 watts, a temperature of about 350 to about 420° C. and a pressure of about 1.4 to about 3.0 Torr, for about 20 to about 70 seconds. Advantageously, treatment of the patterned metal layer with the nitrogen-containing plasma and deposition of the HDP oxide can be conducted in the same tool.

Embodiments of the present invention include forming and patterning a composite metal layer comprising a lower barrier layer, such as Ti, W, Ti—W, titanium nitride (TiN) or titanium—titanium nitride (Ti—TiN), an intermediate primary conductive layer, such as aluminum or an aluminum alloy, e.g. an aluminum alloy containing up to about 1.5 at. % copper, and an ARC, e.g. Ti—TiN. In practicing embodiments of the present invention, any gap filling dielectric material can be employed subsequent to treatment with a nitrogen-containing plasma. Suitable results have been achieved by depositing a HDP oxide, as by high density plasma chemical vapor deposition. In this respect, the methodology disclosed in U.S. patent application Ser. No. 08/924,133, now U.S. Pat. No. 6,046,106, can be employed.

Figure 4:
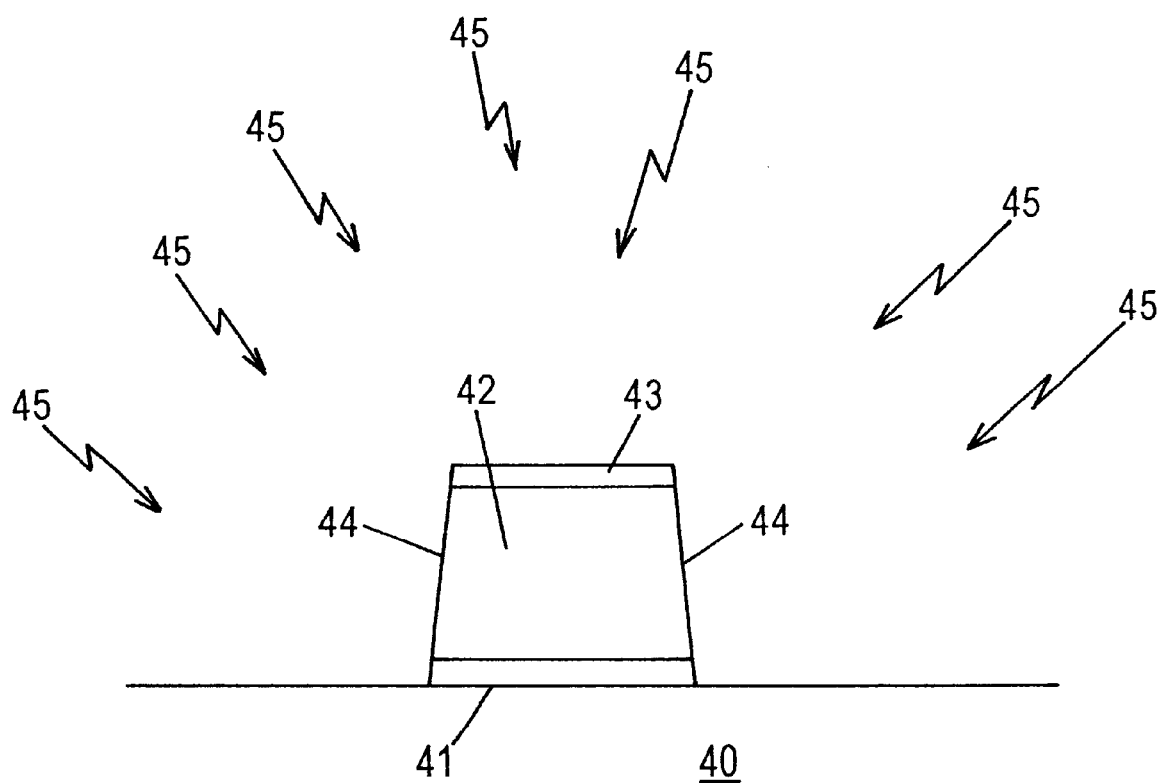
FIGS. 4 and 5 schematically illustrate sequential phases according to an embodiment of the present invention.
Figure 5:
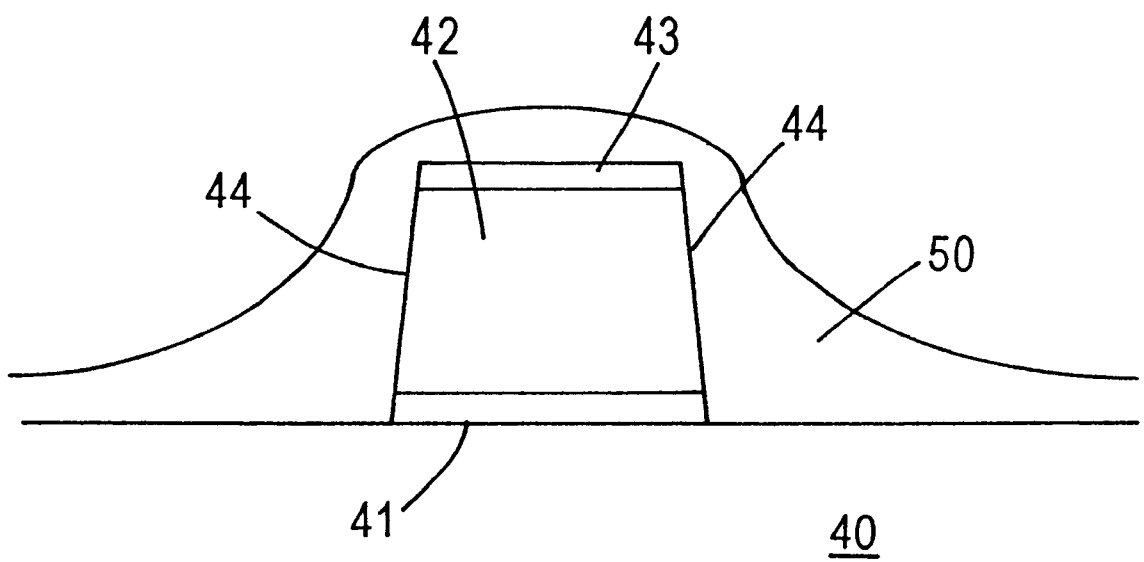

An embodiment of the present invention is schematically illustrated in FIGS. 4 and 5, wherein similar elements bear similar reference numerals. Adverting to FIG. 4, a metal feature is formed on interlayer dielectric 40 in a conventional manner by depositing a composite conductive layer and anisotropically etching employing fluorine and/or chlorine chemistry. The metal feature comprises a lower barrier layer, e.g. Ti, a primary conductive layer 42, e.g. aluminum or aluminum alloy, and an ARC 43, e.g. TiN. After patterning, conventional wet cleaning is performed employing a solvent. After wet cleaning, the patterned metal layer is treated with a nitrogen-containing plasma, indicated by arrows 45, to effectively remove residues from preceding steps, e.g., etching and/or wet cleaning. Subsequently, a dielectric gap filling material 50, e.g. HDP oxide, is deposited, as shown in FIG. 5. As a result of the treatment with the nitrogen-containing plasma (45, FIG. 4), harmful residues are removed thereby avoiding corrosion of the side surfaces 44 of the metal feature. Consequently, voiding is reduced and electromigration resistance is improved.

The present invention provides methodology enabling the efficient manufacture of high density semiconductor devices having a plurality, e.g. five or more, patterned metal layers, with an interconnection system having a design rule of about 0.18 micron and under. In accordance with the present invention, an interconnect system, including borderless vias, can be formed with improved electromigration resistance.

In accordance with embodiments of the present invention, gaps between the metal features, e.g., metal lines, are filled after treatment with a nitrogen-containing plasma by depositing a suitable dielectric gap filling material, such as an HDP oxide employing HDP-chemical vapor deposition. The resulting HDP oxide is relatively conformal. Accordingly, embodiments of the present invention also include depositing another dielectric layer, such as an oxide derived from tetraethyl orthsilicate (TEOS) after depositing the HDP oxide, and planarizing by CMP.

The present invention advantageously enables formation of highly reliable interconnect systems with improved electromigration resistance and reduced voiding. The present invention is applicable to the production of various types of semiconductor devices, particularly high density multi-level semiconductor devices with a design rule of about 0.18 micron and under, exhibiting high speed characteristics and improved reliability. The present invention is cost effective and can easily be integrated into conventional process flows employing conventional equipment.

In carrying out embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers can be formed by conventional metallization techniques, such as various types of CVD processes, including low pressure chemical vapor deposition (LPCVD), and plasma enhanced chemical vapor deposition (PECVD). Normally, when high melting metal point melts such a tungsten are deposited, CVD techniques are employed. Low melting points metals, such as aluminum and aluminum-base alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, it should be recognized the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, the method comprising sequentially:

forming a metal layer;

etching the metal layer to form a patterned metal layer comprising metal features having side surfaces with gaps therebetween;

wet cleaning the patterned metal layer;

treating the patterned metal layer with a nitrogen-containing plasma; and depositing a dielectric material in the gaps.

2. The method according to claim 1, comprising depositing a high density plasma oxide by high density plasma chemical vapor deposition to fill the gaps.

3. The method according to claim 2, comprising treating the patterned metal layer with the nitrogen-containing plasma and depositing the high density plasma oxide in the same tool.

4. The method according to claim 1, comprising wet cleaning with a solvent.

5. The method according to claim 1, comprising etching the metal layer employing an etching recipe comprising flourine and/or chlorine.

6. The method according to claim 5, wherein:

etching and/or wet cleaning result in the formation of residues which can attack the side surface of the metal feature; and the nitrogen-containing plasma treatment substantially removes the residues before depositing the dielectric material.

7. The method according to claim 5, comprising treating the patterned metal layer with the nitrogen-containing plasma at a temperature of at least about 400° C.

8. The method according to claim 7, comprising treating the patterned metal layer with the nitrogen-containing plasma at a:

nitrogen flow rate of about 1,000 to about 5,000 sccm;

source power of about 500 to about 2,500 watts;

bias power of about 200 to about 2,800 watts;

temperature of about 350 to about 420° C.; and pressure of about 1.4 to about 3.0 Torr.

9. The method according to claim 8, comprising treating the patterned metal layer with the nitrogen-containing plasma for about 20 to about 70 seconds.

10. The method according to claim 1, comprising treating the patterned metal layer with a nitrogen-containing plasma to remove residues formed as a result of the etching and/or wet cleaning prior to depositing a dielectric material in the gaps.

* * * * *